(12) United States Patent
Tsang

(10) Patent No.: US 6,812,538 B2
(45) Date of Patent: Nov. 2, 2004

(54) MRAM CELLS HAVING MAGNETIC WRITE LINES WITH A STABLE MAGNETIC STATE AT THE END REGIONS

(75) Inventor: David Tsang, Cupertino, CA (US)

(73) Assignee: Applied Spintronics Technology, Inc., Milpitas, CA (US)

( * ) Notice: Subject to any disclaimer, the term of this patent is extended or adjusted under 35 U.S.C. 154(b) by 0 days.

(21) Appl. No.: 10/669,216

(22) Filed: Sep. 23, 2003

(65) Prior Publication Data

US 2004/0150017 A1 Aug. 5, 2004

Related U.S. Application Data

(60) Provisional application No. 60/444,886, filed on Feb. 5, 2003.

(51) Int. Cl.$^7$ .......................... H01L 29/82; H01L 43/00
(52) U.S. Cl. .............................. 257/421; 257/E27.006; 257/295
(58) Field of Search ........................ 257/421, E27.006, 257/295

(56) References Cited

U.S. PATENT DOCUMENTS

| 5,659,499 A | 8/1997 | Chen et al. |
| 5,940,319 A | 8/1999 | Durlam et al. |
| 6,153,443 A | 11/2000 | Durlam et al. |
| 6,211,090 B1 | 4/2001 | Durlam et al. |
| 2002/0127743 A1 | 9/2002 | Nickel et al. |
| 2003/0123283 A1 * | 7/2003 | Amano et al. ............... 365/173 |

* cited by examiner

Primary Examiner—David Nelms
Assistant Examiner—Tu-Tu Ho
(74) Attorney, Agent, or Firm—Sawyer Law Group LLP (57) ABSTRACT

A method and system for providing and using a magnetic memory are disclosed. The magnetic memory includes a plurality of magnetic memory cells, a plurality of magnetic write lines and a plurality of magnetic biasing structures. The plurality of magnetic write lines have a plurality of end regions. The plurality of magnetic biasing structures coupled to the plurality of end regions of the plurality of magnetic write lines.

19 Claims, 7 Drawing Sheets

MRAM CELLS HAVING MAGNETIC WRITE LINES WITH A STABLE MAGNETIC STATE AT THE END REGIONS

CROSS-REFERENCE TO RELATED APPLICATIONS

This application is claiming under 35 USC 119(e) the benefit of provisional patent application Ser. No. 60/444,886 filed on Feb. 5, 2003.

The present application is related to co-pending U.S. patent application Ser. No. 10/459,133 entitled "MRAM MEMORIES UTILIZING MAGNETIC WRITE LINES", filed on Jun. 11, 2003, which claims benefit of provisional application Ser. No. 60/431,742 filed on Dec. 9, 2002, and assigned to the assignee of the present application.

FIELD OF THE INVENTION

The present invention pertains to magnetic memories, and more particularly to a method and system for providing a magnetic random access memory (MRAM) that is preferably high density, nonvolatile and that incorporates write-lines having improved writing efficiencies, ease of manufacturing, and better reliability against electromigration.

BACKGROUND OF THE INVENTION

Figure 1:
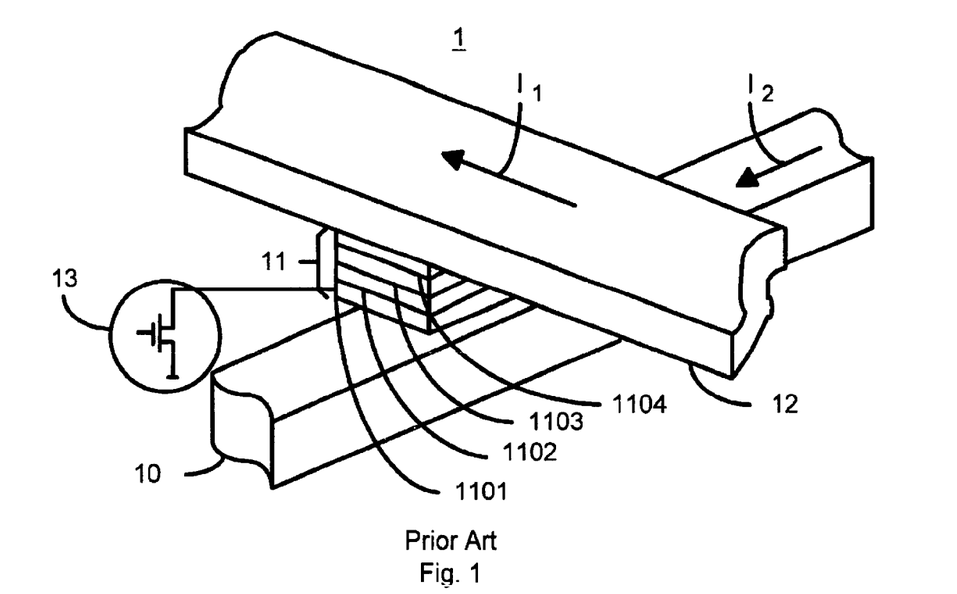
FIG. 1 is a three-dimensional view of a portion of a conventional magnetic memory including a MTJ cell, located at the intersection of a bit line and a word line.

Recently, a renewed interest in thin-film magnetic random access memories (MRAM) has been sparked by the potential application of MRAM to both nonvolatile and volatile memories. FIG. 1 depicts a portion of a conventional MRAM 1. The conventional MRAM includes conventional orthogonal conductor lines 10 and 12, conventional magnetic storage cell 11 and conventional transistor 13. The conventional MRAM 1 utilizes a conventional magnetic tunneling junction (MTJ) stack 11 as a memory cell. Use of a conventional MTJ stack 11 makes it possible to design an MRAM cell with high integration density, high speed, low read power, and soft error rate (SER) immunity. The conductive lines 10 and 12 are used for writing data into the magnetic storage device 11. The MTJ stack 11 is located on the intersection of and between 10 and 12. Conventional conductive line 10 and line 12 are referred to as the conventional word line 10 and the conventional bit line 12, respectively. The names, however, are interchangeable. Other names, such as row line, column line, digit line, and data line, may also be used.

The conventional MTJ 11 stack primarily includes the free layer 1104 with the changeable magnetic vector (not explicitly shown), the pinned layer 1102 with the fixed magnetic vector (not explicitly shown), and the insulator 1103 in between the two magnetic layers 1104 and 1102. The insulator 1103 typically has a thickness that is low enough to allow tunneling of charge carriers between the magnetic layers 1102 and 1104. Layer 1101 is usually a composite of seed layers and an anti-ferromagnetic layer that is strongly coupled to the pinned magnetic layer.

Data is stored in the conventional MTJ stack 11 by applying a magnetic field to the conventional MTJ stack 11. The applied magnetic field has a direction chosen to move the changeable magnetic vector of the free layer 1104 to a selected orientation. During writing, the electrical current $I_1$ flowing in the conventional bit line 12 and $I_2$ flowing in the conventional word line 10 yield two magnetic fields on the free layer 1104. In response to the magnetic fields generated by the currents $I_1$ and $I_2$, the magnetic vector in free layer 1104 is oriented in a particular, stable direction. This direction depends on the direction and amplitude of $I_1$ and $I_2$ and the properties and shape of the free layer 1104. Generally, writing a zero (0) requires the direction of either $I_1$ or $I_2$ to be different than when writing a one (1). Typically, the aligned orientation can be designated a logic 1 or 0, while the misaligned orientation is the opposite, i.e., a logic 0 or 1, respectively.

Stored data is read or sensed by passing a current through the conventional MTJ cell from one magnetic layer to the other. During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

Figure 2:
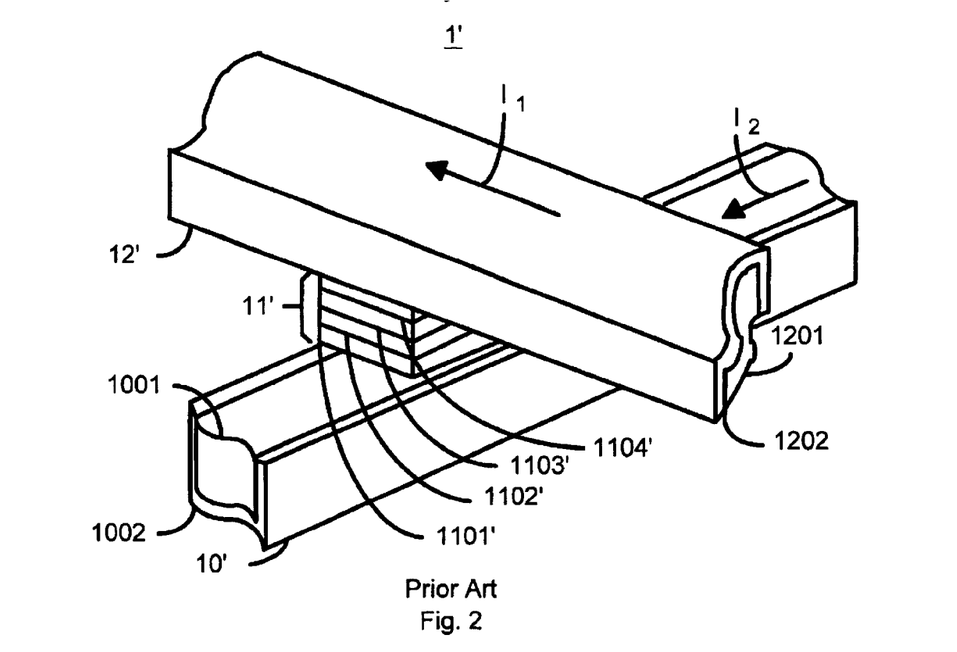
FIG. 2 is a three-dimensional view of a portion of a conventional magnetic memory including a MTJ cell, located at the intersection of a bit line and a word line, where the bit line and the word line have magnetic cladding to improve write efficiency.

FIG. 2 depicts a portion of a conventional magnetic memory 1' that has a lower writing current. Similar systems are described in U.S. Pat. No. 5,659,499, U.S. Pat. No. 5,940,319, U.S. Pat. No. 6,211,090, U.S. Pat. No. 6,153,443, and U.S. Patent Application Publication No. 2002/0127743. The conventional systems and conventional methods for fabricating the conventional systems disclosed in these references encapsulate bit lines and word lines with soft magnetic cladding layer on the three surfaces not facing MTJ cell 11'. Many of the portions of the conventional memory depicted in FIG. 2 are analogous to those depicted in FIG. 1 and are thus labeled similarly. The system depicted in FIG. 2 includes the conventional MTJ cell 11', conventional word line 10' and bit line 12'. The conventional word line 10' is composed of two parts: a copper core 1001 and a soft magnetic cladding layer 1002. Similarly, the conventional bit line 12' is composed of two parts: a copper core 1201 and a soft magnetic cladding layer 1202.

Relative to the design in FIG. 1, the soft magnetic cladding layers 1002 and 1202 can concentrate the magnetic flux associated with $I_1$ and $I_2$ onto the MTJ cell 11' and reduce the magnetic field on the surfaces which are not facing the MTJ cell 11'. Thus, the sot magnetic cladding layers 1002 and 1202 concentrate the flux on the MTJ that makes up the MTJ cell 11', making the free layer 1104 easier to program.

Although this approach works theoretically, one of ordinary skill in the art will readily recognize that the magnetic properties of the portions of the soft cladding layers 1002 and 1202 on the vertical sidewalls of the conventional lines 10' and 12', respectively, are hard to control. One of ordinary skill in the art will also recognize that the process of making the conventional word line 10' and the conventional bit line 12' is complicated. Formation of the conventional word line 10' and conventional bit line 12' including the cladding layers 1002 and 12002, respectively, requires approximately nine thin film deposition steps, five photolithography steps, six etching steps, and one chemical mechanical polishing (CMP) step. Furthermore, none of the processes can be shared with other CMOS processes. Some of the processes, such as the CMP process and a few thin-film deposition and etching processes, need to be tightly controlled in order to achieve the designed performance. Because the wafer surface on which the devices are fabricated is not flat and the portion to be removed is deep in the trenches, the write lines 10' and 12' need to be laid out fairly sparsely to accommodate the photolithography process. As a consequence, the density and capacity of memory devices on a chip will be sacrificed if soft magnetic cladding layer 1202 and 1002 is used for the lines 10' and 12'. This complicated fabrication methods pose significant challenge to scaling to higher densities. Accordingly it is highly desirable to provide an MRAM architecture which is scalable, easy to fabricate, and offers high writing efficiency.

Other aspects of the conventional write lines 10, 10', 12, and 12' of the conventional designs depicted in both FIG. 1 and FIG. 2 limit scalability. In these conventional designs, the conventional write lines 10, 10', 12, and 12'are mostly made of either aluminum or copper. The current density limits for aluminum and copper are in the order of $1 \times 10^6$ $A/cm^2$ or less. As the line width decreases to increase the memory density, the electromigration current density limit poses severe challenges for scaling.

Other conventional systems attempt to propose different solutions, each of which has its drawbacks. As an example, U.S. Patent Application Publication No. 2002/0080643 proposed that, after a write operation, a reverse current is applied to the write lines to prevent electromigration. But such conventional methods compromise performance by reducing the speed of the memory and add complexities. Thus, it is also highly desirable to have write line made of materials with high reliability in electromigration, which will allows for easy scalability to high density memory arrays.

Conventional thin bit lines, which might be used for smaller or more efficient memories have shortcomings. Thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. Examples of such design are disclosed in U.S. Pat. No. 6,335,890 and U.S. Patent Application Publication No. 2002/0034117. However, the other problems described above, such as the electromigration are still not overcome.

Accordingly, what is needed is a system and method for providing a scalable, efficient, low current magnetic memory that improves ease of manufacturing and reliability against electromigration. The present invention addresses such a need.

SUMMARY OF THE INVENTION

The present invention provides a method and system for providing and using a magnetic memory. The magnetic memory includes a plurality of magnetic memory cells, a plurality of magnetic write lines and a plurality of magnetic biasing structures. The plurality of magnetic write lines have a plurality of end regions. The plurality of magnetic biasing structures is coupled to the plurality of end regions of the plurality of magnetic write lines.

According to the system and method disclosed herein, the present invention provides a magnetic memory having an improved efficiency, improved reliability against electromigration, and improved magnetic stability, while being simpler to fabricate.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 3:
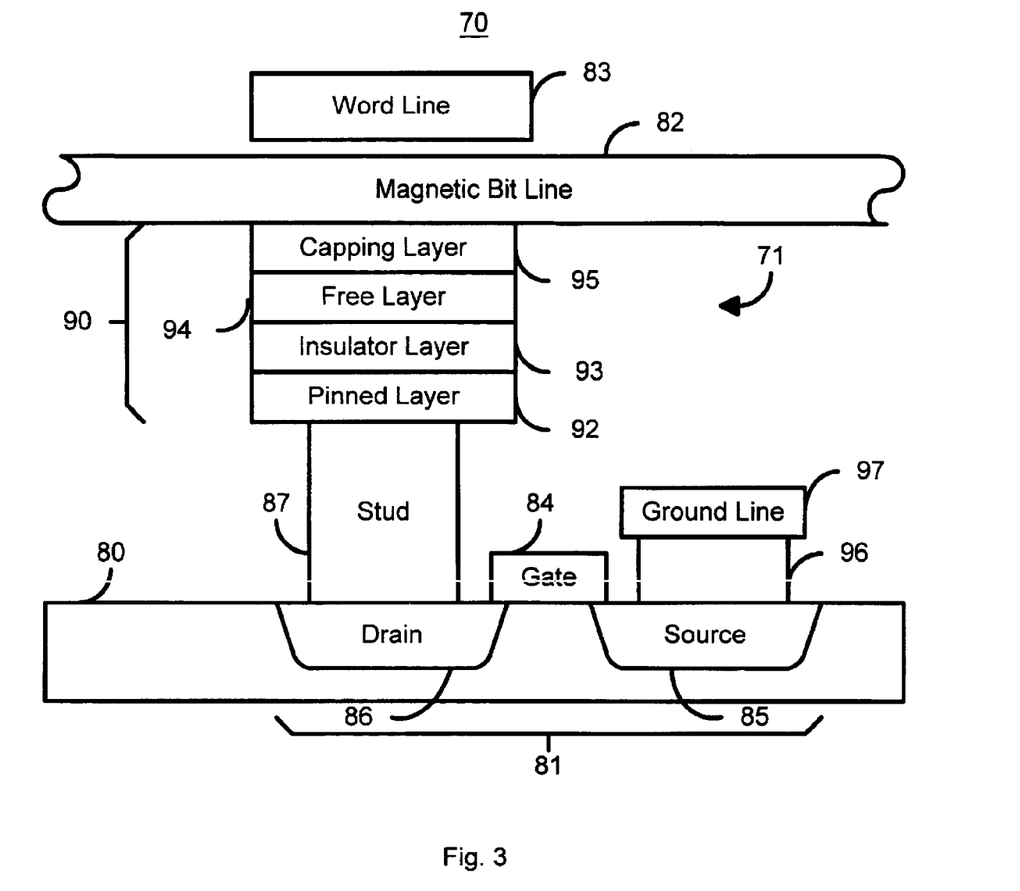
FIG. 3 depicts a cross-sectional view of an architecture including a MTJ MRAM cell and a magnetic write line.

Co-pending U.S. patent application Ser. No. 10/459,133 entitled "MRAM MEMORIES UTILIZING MAGNETIC WRITE LINES" assigned to the assignee of the present application describes a MRAM architecture that addresses many of the issues encountered in conventional MRAM deices. Applicant hereby incorporates by reference the above-identified co-pending application. FIG. 3 depicts one embodiment of a portion of an MRAM 70 including the basic structure described in the above-identified co-pending application. The MRAM 70 depicted in FIG. 3 includes a magnetic cell 71 having a magnetic element 90, which is preferably a MTJ stack 90. The MRAM 70 includes a selection device 81 formed in a substrate 80, a magnetic write line 82, a bit line 83, a conductive stud 87, connecting stud 96 and ground line 97. The selection device 81 is preferably a FET transistor including gate 84, source 85 and drain 86. The MTJ stack also includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. The soft magnetic materials preferably include cobalt, nickel, iron, and/or alloys thereof. Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved.

Although the MRAM architecture described in the above-identified co-pending application functions well for its intended purpose, one of ordinary skill in the art will readily recognize that the magnetic write lines 82 may be subject to magnetic instability at the end region of the magnetic write line 82. Due to the demagnetizing field associated with the end surface of the magnetic write line 82, the magnetic state of the end region of the magnetic write line 82 is not the same as that in the mid section. Furthermore, the magnetic state of the end region of the magnetic write line 82 may not be stable. Consequently, the write efficiency of the end region and that of the mid section of the magnetic write line 82 are not the same, and the write efficiency of the end region may change from one write operation to another, a major issue for the design and operation of MRAM devices. Therefore it is desirable to have a MRAM architecture that utilizes the magnetic write line structure for write efficiency but does not have the issues related to magnetic instability.

Accordingly it is highly desirable to provide an MRAM architecture that utilizes magnetic write lines for improved writing efficiency but is more magnetically stable.

The present invention provides a method and system for providing and using a magnetic memory. The magnetic memory includes a plurality of magnetic memory cells, a plurality of magnetic write lines and a plurality of magnetic biasing structures. The plurality of magnetic write lines have a plurality of end regions. The plurality of magnetic biasing structures is coupled to the plurality of end regions of the plurality of magnetic write lines. The location and shape of the biasing structure(s) depends upon the material used in forming the biasing structures. For example, if the biasing structure includes a hard magnetic material, the biasing structures are preferably at the ends of the magnetic write lines. If the biasing structures are antiferromagnetic exchange bias tabs, the biasing structures may be placed above or below the ends of the magnetic write lines. If the biasing structures are made by shaping the ends of the word lines, then the biasing structures are preferably at the ends of the magnetic write lines.

The present invention will be described in terms of particular types of magnetic memory cells, particular materials, and a particular configuration of elements. However, one of ordinary skill in the art will readily recognize that this method and system will operate effectively for other magnetic memory cells, and other materials and configurations non inconsistent with the present invention. One of ordinary skill in the art will also readily recognize that although the present invention are described in terms of magnetic bit lines, the method and system are consistent with the magnetic write lines, digit lines, or simply write lines. Similarly, the present invention is described in the context of MRAM cells. One of ordinary skill in the art will, however, recognize that the present invention can be used in conjunction with other magnetic devices not inconsistent with the present invention. Furthermore, the present invention is described in the context of metal-oxide-semiconductor (MOS) devices and magnetic tunneling junction (MTJ) devices. However, one of ordinary skill in the art will readily recognize that the present invention is not limited to such devices. Instead, other suitable devices, for example such as bipolar junction transistor devices and spin-valve giant magnetoresistive memory elements, may be used with or without modification to the inventive memory architecture. Thus, the method and system in accordance with the present invention are more generally applicable to magnetic devices for which improved magnetic stability is desired. Moreover, the present invention is described in the context of certain biasing structures. However, one of ordinary skill in the art will readily recognize that additional and/or other biasing structures not inconsistent with the present invention, as well as combinations of the biasing structures described herein can be utilized.

Figure 4:
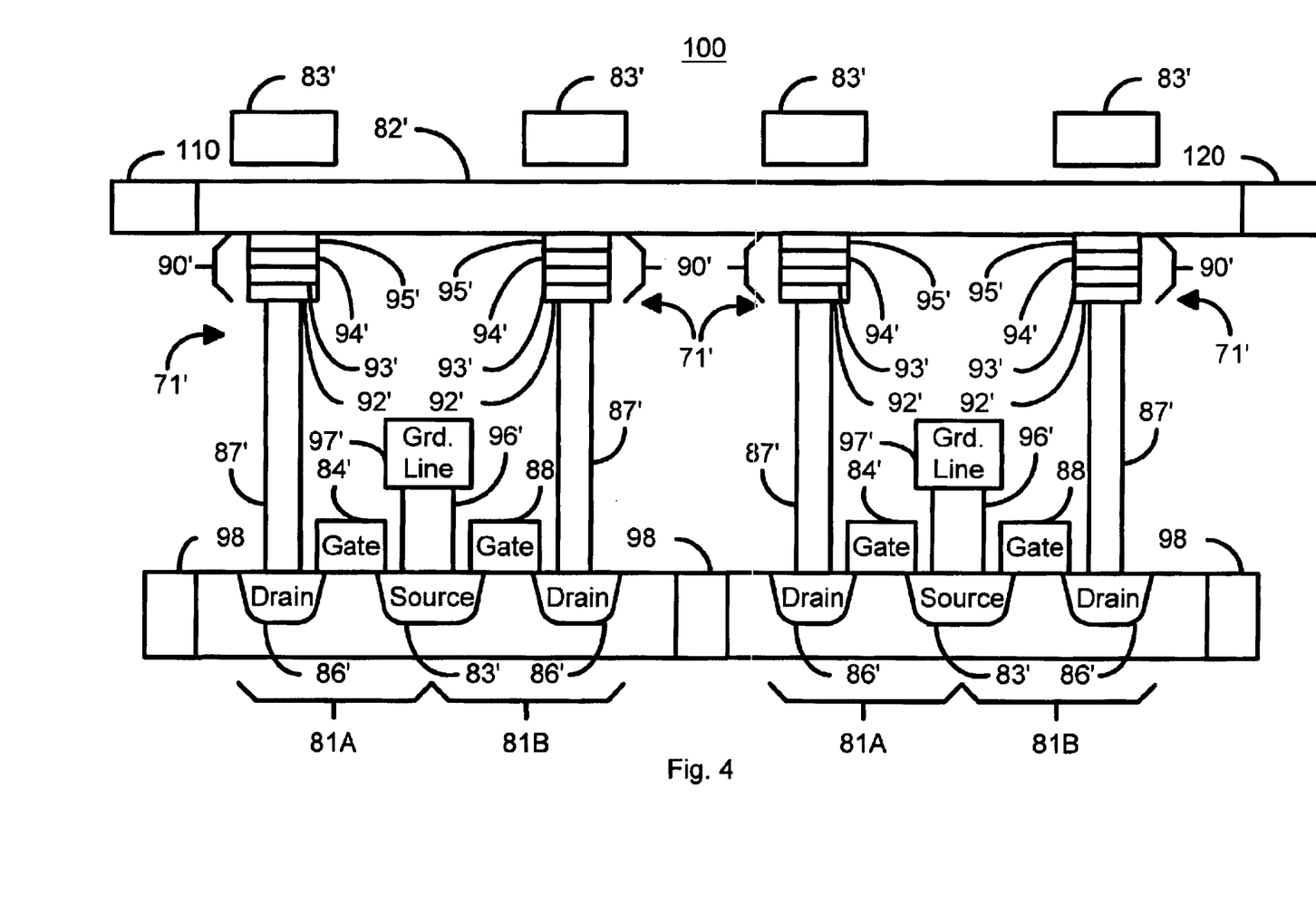
FIG. 4 depicts one embodiment of a MRAM having improved magnetic stability in accordance with the present invention.

FIG. 4 depicts one embodiment of a portion of a MRAM 100 having improved magnetic stability in accordance with the present invention. Many of the elements of the MRAM 100 are analogous to the MRAM 70 depicted in FIG. 3. Consequently, the elements are labeled similarly. For example, the MRAM 100 includes a magnetic write line 82', which is preferably a word line, that is analogous to the magnetic write line 82. Also depicted in FIG. 4 are four MRAM cells 71' having a magnetic write line 82'. Two MRAM cells 71' share a single source 83' and have an additional gate 88. There are thus two selection devices 81A and 81B for each pair of cells 71'. In addition, pairs of cells 71' are separated by isolation structures 98. In addition, the MRAM 100 includes biasing structures 110 and 120 that include hard magnetic material(s). Thus, the magnetic write line 82' is coupled with hard magnetic material biasing structures 110 and 120 at each end.

In the embodiment shown, the magnetic write line 82' is associated with four MTJ cells 71'. However, in an alternate embodiment, the magnetic write line 82' may be associated with another number of magnetic cells. Hard magnetic material biasing structures 110 and 120 are formed at both ends of the write line. The hard magnetic bias material biasing structures 110 and 120 can include a single layer of metallurgy such as Co Cr, Co Pt or Co Cr Pt. In another embodiment, an under-and/or overcoat layer such as Cr, W, Ti or alloy of these elements can be used to improve the property of the Co Cr, Co Pt or Co Cr Pt film.

For the each of the hard magnetic material biasing structures 110 and 120, the product of 'Mr', the remnant magnetization of the hard magnetic material forming the biasing structures 110 and 120, and 't', the thickness of the hard magnetic material 110 and 120 should be no less than the product of 'Ms', the saturation magnetization of the write line 82', and 'd', the thickness of the write line 82'. With these conditions, the magnetic vector in the end region of the write line 82 is stabilized by the hard magnetic material biasing structures 110 and 120 abutted to it. The magnetization directions of the hard bias material biasing structures 110 and 120 are aligned by an externally applied magnetic field to the preferred direction of magnetization of the magnetic write line 82'. Each of the hard magnetic material biasing structures 110 and 120 includes hard magnetic material and thus has a magnetic vector that is very difficult to change. In a preferred embodiment, the magnetic vector does not change in a magnetic field of less than 2000

Oersted. The magnetic vectors of the hard magnetic material biasing structures 110 and 120 are preferably aligned with that of the magnetic write line 82'.

Thus, using the hard magnetic material biasing structures 110 and 120, the magnetization of the magnetic write line 82' can be stabilized. In particular, the magnetization of the magnetic write line 82' and the ends is oriented in the same direction as the remainder of the magnetic write line. Consequently, instabilities in the magnetization of the magnetic write line 82 are reduced and performance is improved.

Figure 5A:
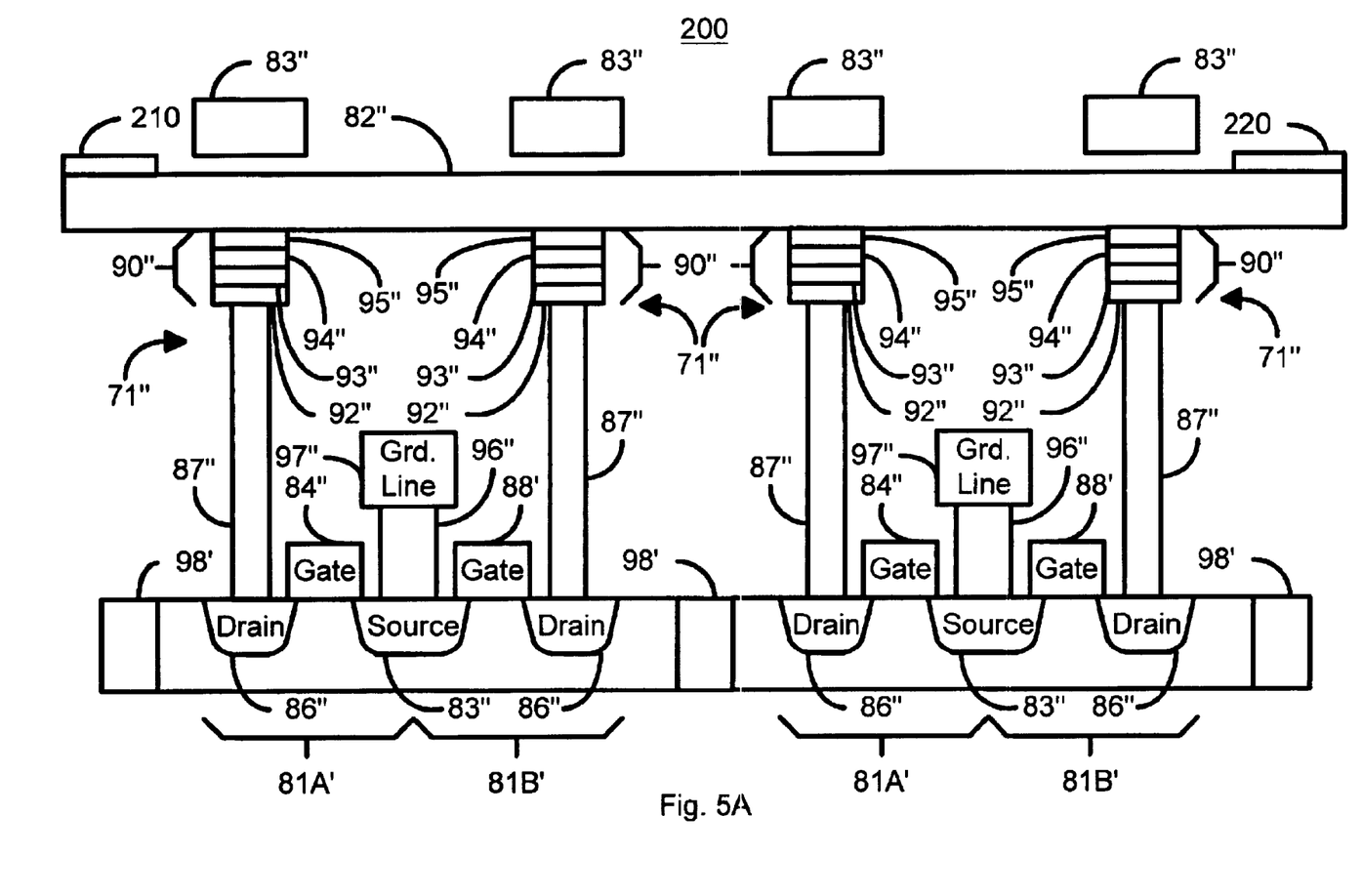
FIG. 5A depicts a second embodiment of a MRAM having improved magnetic stability in accordance with the present invention.

FIG. 5A depicts another embodiment of a portion of an MRAM 200 having improved magnetic stability in accordance with the present invention. Many of the elements of the MRAM 200 are analogous to the MRAM 70 depicted in FIG. 3. Consequently, the elements are labeled similarly. For example, the MRAM 200 includes a magnetic write line 82", which is preferably a word line, that is analogous to the magnetic write line 82. Also depicted in FIG. 5A are four MRAM cells 71" having a magnetic write line 82". In the embodiment shown, the magnetic write line 82" is associated with four MTJ cells 71". However, in an alternate embodiment, the magnetic write line 82" may be associated with another number of magnetic cells. The magnetic write line 82" is coupled with bias structures 210 and 220. Thus, the magnetic write line 82" is coupled with antiferromagnetic exchange bias tabs 210 and 220 at each end.

The MRAM 200 includes magnetic cells 71" coupled to the magnetic write line 82" having antiferromagnetic exchange bias tabs 210 and 220 on the top surface at both ends, formed in accordance with the present invention. The exchange bias tabs 210 and 220 are preferably produced by patterning one or more antiferromagnetic layer(s), leaving the antiferromagnetic exchange bias tabs 210 and 220. As a result, the antiferromagnetic exchange bias tabs 210 and 220 cover only the end regions of magnetic write line 82". The antiferromagnetic exchange bias tabs 210 and 220 create an interfacial exchange interaction that results in an effective bias field on the word line 82" at the end regions. This effective bias field is oriented along the long axis of the magnetic write line 82" by orienting the antiferromagnetic material(s) for the antiferromagnetic exchange bias tabs 210 and 220. In one embodiment, the orientation of the antiferromagnetic material(s) is provided through the deposition process. In another embodiment, the orientation of the antiferromagnetic material(s) are provided by heating the magnetic write line 82" and the antiferromagnetic material(s) above the ordering temperature of the antiferromagnetic material(s). The antiferromagnetic material(s) and magnetic write line 82" are then cooled in an externally applied unidirectional magnetic field. For such an embodiment, antiferromagnetic material(s) used for the antiferromagnetic exchange bias tabs 210 and 220 have Néel temperature(s) above the operation temperature of the MRAM 200.

The MRAM 200 depicted in FIG. 5A has the antiferromagnetic exchange bias tabs 210 and 220 on the top surface of magnetic write line 82. However, one of ordinary skill in the in the art will readily recognize that the antiferromagnetic exchange bias tabs 210 and 220 could be exchange coupled to the bottom surface of the magnetic write line 82. In such an embodiment, the antiferromagnetic material(s) used in forming the antiferromagnetic exchange bias tabs 210 and 220 are provided before the magnetic write line 82". Thus, the bottom surface of the magnetic write line 82" would be exchange coupled to the antiferromagnetic exchange bias tabs 210 and 220 to yield the desired bias effect. Furthermore, in some embodiments, the exchange bias at the end of the magnetic write line 82" due to the antiferromagnetic exchange bias tabs 210 and 220 may be in a different direction from the exchange bias used to pin the magnetization of the pinned layer 92" of the MTJ stack 90". In such an embodiment, antiferromagnetic materials with different blocking temperatures could be used for the antiferromagnetic exchange bias tabs 210 and 220 and the antiferromagnetic layer (not shown) that pins the magnetization of the pinned layer 92". Magnetic annealing at different temperature for each of the antiferromagnetic materials could be used to fix the exchange bias in the preferred directions.

Figure 5B:
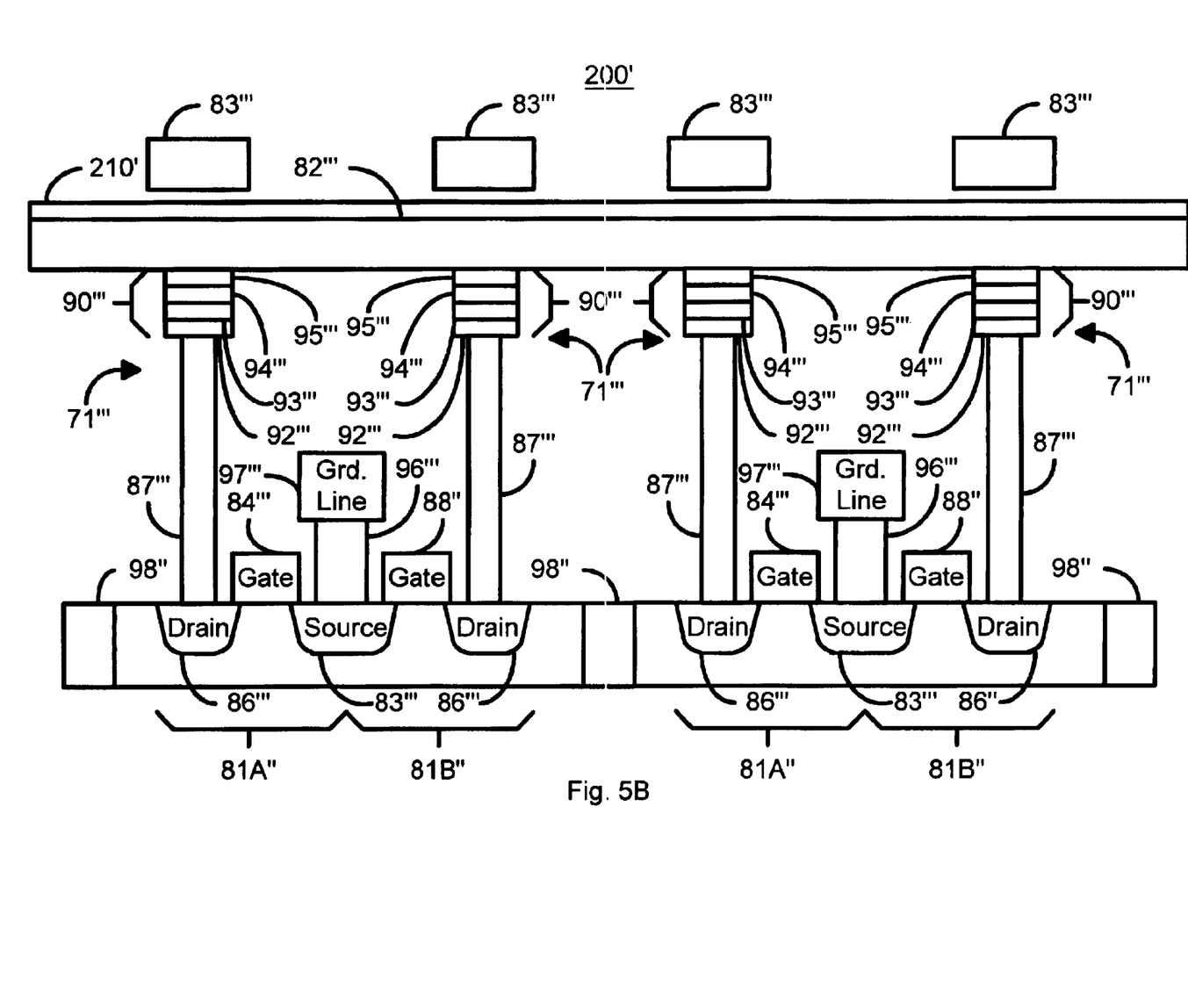
FIG. 5B depicts another embodiment of a MRAM having improved magnetic stability in accordance with the present invention.

FIG. 5B depicts another embodiment of an MRAM 200' using antiferromagnetic materials to improve the magnetic stability of the MRAM 200'. Many of the elements of the MRAM 200' are analogous to the MRAM 200 depicted in FIG. 5A. Consequently, the elements are labeled similarly. For example, the MRAM 200' includes a magnetic write line 82''' and antiferromagnetic layer 210'. In the MRAM 200', the layer of antiferromagnetic exchange material 210' has the same dimension as the magnetic write line 82''' and is preferably placed on the magnetic write line 82'''. However, in this embodiment, the biasing structure including antiferromagnetic material(s) can be below the magnetic write line 82'''. The antiferromagnetic material 210' covers the word line to achieve the desired improvement in stability. In this embodiment, the antiferromagnetic layer 210' can be patterned using the same photolithography process that forms the magnetic word line 82'''. However, the exchange strength may need to be reduced from the case where the antiferromagnetic exchange tabs 210 and 220 are only limited to the end region.

Using the exchange bias tabs 210 and 220 and 210', an exchange bias field can be used to orient the magnetic vectors of the ends of the magnetic write line 82" and 82''', respectively. As a result, the magnetic moments of the ends of the magnetic write lines 82" and 82''' are stabilized to be in the same direction as the magnetic vector of the remainder of the magnetic write lines 82" and 82'''. Consequently, performance of the MRAM 200 and 200' is improved.

Figure 6A:
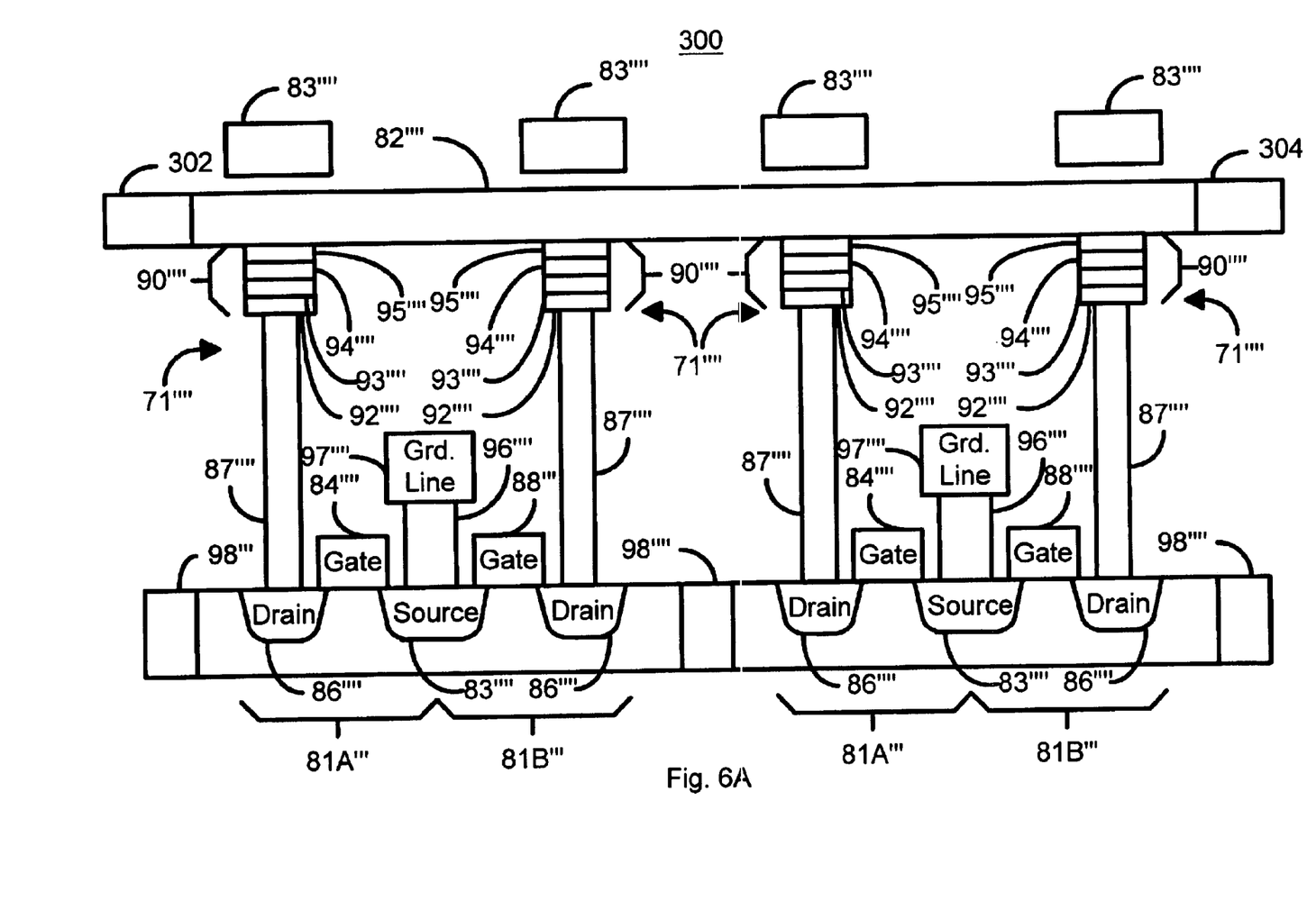
FIG. 6A depicts another embodiment of an MRAM in accordance with the present invention.

FIG. 6A depicts another embodiment of an MRAM 300 in accordance with the present invention. FIGS. 6B–6E depict top views of the end regions of the magnetic write line 82"" for biasing structures having different shapes. Many of the elements of the MRAM 300 are analogous to the MRAM 70 depicted in FIG. 3. Consequently, the elements are labeled similarly. For example, the MRAM 300 includes a magnetic write line 82"". The MRAM 300 includes biasing structures 302 and 304 that are actually formed by shaping the end regions of the magnetic write line 82"". The end regions 320 and 322, 330 and 332, and 340 and 342 are thus embodiments of the end regions 302 and 304 depicted in FIG. 6A. The end regions 320 and 322, 330 and 332, and 340 and 342 are thus preferably formed from the same magnetic material as the remainder of the magnetic word line 82"". In the embodiment shown, the magnetic write line 82"" is associated with four MTJ cells 71"". However, in an alternate embodiment, the magnetic write line 82"" may be associated with another number of magnetic cells.

Figure 6B:
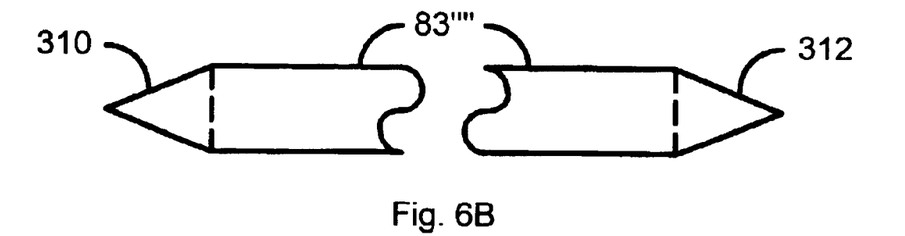
FIGS. 6B–6E depict the end regions of the magnetic write line for biasing structures having different shapes.

In the embodiment shown in FIG. 6B, the end of magnetic write line 82"" is a tapered and symmetrical about the long axis of line 82. In such a configuration, the magnetization of magnetic write line 82''' is not at a right angle with the end surfaces 310 and 312 of the magnetic write line 82"". As a result the density of magnetic charges on the end surfaces 310 and 312 is reduced. Furthermore, the demagnetization field which causes instability is decreased.

Figure 6C:
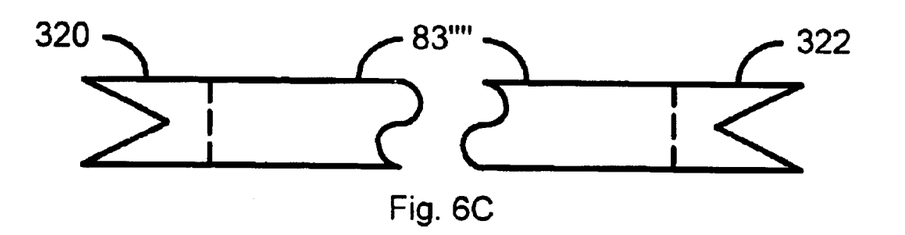
Figure 6D:
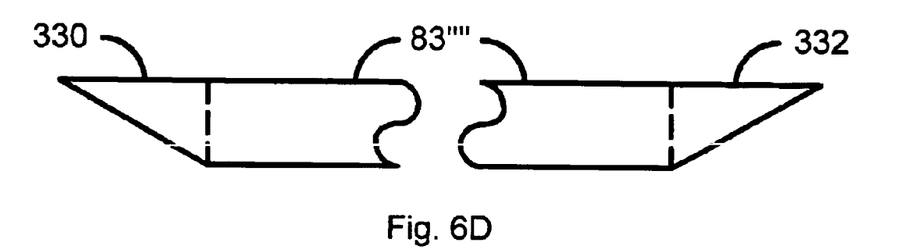
Figure 6E:
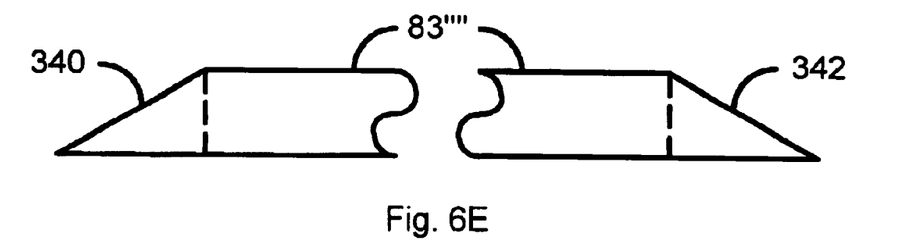

Similarly, FIGS. 6C, 6D, and 6E have magnetic biasing structures formed by end regions 320 and 322, 330 and 332, and 340 and 342, respectively. The shapes of the end regions 320 and 322, 330 and 332, and 340 and 342 reduce the demagnetization field associated with the end surfaces 320 and 322, 330 and 332, and 340 and 342, respectively, of the magnetic write word line 82'''. Using the embodiments depicted in FIGS. 6D and 6E may, however, introduce some performance asymmetry in the writing process for the magnetic cells near the ends 330, 332, 340, and 341. In addition, the end regions 310 and 312 depicted in FIG. 6B are easier to fabricate than the end regions 320 and 322 shown in FIG. 6C if minimum feature size is used for the width of magnetic write line 82''''.

Thus, the MRAMs 100, 200, 200' and 300 have improved magnetic stability. The MRAMs 100, 200, 200', and 300 use additional biasing structures to bias the magnetic moments at the ends of the magnetic write line. The biasing structures of the MRAMs 100, 200 and 200' are hard magnetic and antiferromagnetic materials. Similarly, the MRAM 300 uses biasing structures formed by shaping the end regions of the magnetic write line. Consequently, the magnetization of the magnetic write line is stabilized. Performance of the MRAMs 100, 200, 200' and 300 is, therefore, improved.

A method and system has been disclosed for providing a magnetic memory having improved writing efficiency, better reliability, simpler fabrication, and improved magnetic stability. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising
   a plurality of magnetic memory cells,
   a plurality of magnetic write lines coupled with the plurality of magnetic memory cells, the plurality of magnetic write lines having a plurality of end regions; and
   a plurality of magnetic biasing structures coupled to the plurality of end regions.

2. The magnetic memory of claim 1 wherein the plurality of magnetic biasing structures include a plurality of hard magnetic biasing structures coupled to the plurality of end regions.

3. The magnetic memory of claim 1 wherein the plurality of magnetic write lines include a plurality of tops and wherein the plurality of magnetic biasing structures include a plurality of antiferromagnetic biasing structures in contact with the plurality of tops and coupled to the plurality of end regions.

4. The magnetic memory of claim 1 wherein the plurality of magnetic write lines include a plurality of bottoms and wherein the plurality of magnetic biasing structures include a plurality of antiferromagnetic biasing structures in contact with the plurality of bottoms and coupled to the plurality of end regions.

5. The magnetic memory of claim 1 wherein the plurality of magnetic write lines include a plurality of tops and wherein the plurality of magnetic biasing structures are formed from the plurality of end regions, each of the plurality of biasing structures having a surface forming an angle with a top of the plurality of tops of a corresponding magnetic write line, the angle being different form a right angle.

6. The magnetic memory of claim 1 wherein the plurality of magnetic write lines include a plurality of magnetic bit lines electrically connected to the plurality or magnetic memory cells.

7. The magnetic memory of claim 6 wherein the plurality of magnetic memory cells include a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer.

8. The magnetic memory of claim 7 wherein the plurality of magnetic bit lines are separated from the free layer by less than or equal to three hundred Angstroms.

9. The magnetic memory of claim 8 wherein each of the plurality of magnetic tunneling junction stacks includes a nonmagnetic spacer layer between the free layer and a corresponding magnetic bit line, the nonmagnetic spacer layer being conductive.

10. A method for utilizing a magnetic memory comprising the steps of:
   (a) in a write mode, writing to a first portion of a plurality of memory cells, the plurality of memory cells being coupled to a plurality of magnetic write lines, the plurality of magnetic write lines having a plurality of end regions and carrying a current for writing to at least one of the plurality of magnetic memory cells, a plurality of magnetic biasing structures coupled to the plurality of end regions;
   (b) in a read mode, reading from a second portion of the plurality of memory cells.

11. A method for providing a magnetic memory comprising
   (a) providing a plurality of magnetic memory cells,
   (b) providing a plurality of magnetic write lines coupled with the plurality of magnetic memory cells, the plurality of magnetic write lines having a plurality of end regions; and
   (c) providing a plurality of magnetic biasing structures coupled to the plurality of end regions.

12. The method of claim 11 wherein the magnetic biasing structures providing step (c) further includes the steps of:
   (c1) providing a plurality of hard magnetic biasing structures coupled to the plurality of end regions.

13. The method of claim 11 wherein the plurality of magnetic write lines include a plurality of tops and wherein magnetic biasing structures providing step (c) further includes the steps of:
   (c1) providing a plurality of antiferromagnetic biasing structures in contact with the plurality of tops and coupled to the plurality of end regions.

14. The method of claim 11 wherein the plurality of magnetic write lines include a plurality of bottoms and wherein the magnetic biasing structures providing step (c) further includes the steps of:
   (c1) providing a plurality of antiferromagnetic biasing structures in contact with the plurality of bottoms and coupled to the plurality of end regions.

15. The method of claim 11 wherein the plurality of magnetic write lines include a plurality of tops and wherein the magnetic biasing structures providing step (c) further includes the step of:
   (c1) forming the plurality of magnetic biasing structures from the plurality of end regions, each of the plurality of biasing structures having a surface forming an angle with a top of the plurality of tops of a corresponding magnetic write line, the angle being different form a right angle.

16. The method of claim 11 wherein the magnetic write line providing step (b) further includes the step of:

(b1) providing a plurality of magnetic bit lines electrically connected to the plurality or magnetic memory cells.

17. The method of claim 16 wherein the magnetic memory cells providing step (a) further includes the steps of:

(a1) providing a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer.

18. The method of claim 17 wherein the plurality of magnetic bit lines are separated from the free layer by less than or equal to three hundred Angstroms.

19. The method of claim 18 wherein each of the plurality of magnetic tunneling junction stacks includes a nonmagnetic spacer layer between the free layer and a corresponding magnetic bit line, the nonmagnetic spacer layer being conductive.

* * * * *